United States Patent [19]

Schiek et al.

[11] Patent Number: 5,440,236

[45] Date of Patent: Aug. 8, 1995

[54] CALIBRATING A NETWORK ANALYZER BY MAKING MULTIPLE MEASUREMENTS ON A COMMON TRANSMISSION LINE WITH A MOVABLE DISCONTINUITY

[75] Inventors: Burkhard Schiek, Bochum; Holger Heuermann, Witten, both of Germany

[73] Assignee: Rohde & Schwarz GmbH & Co. KG, Munich, Germany

[21] Appl. No.: 55,259

[22] Filed: Apr. 28, 1993

[30] Foreign Application Priority Data

May 2, 1992 [DE] Germany .................. 42 14 660.7

[51] Int. Cl.⁶ .............................................. G01R 27/02
[52] U.S. Cl. ..................................... 324/601; 324/638
[58] Field of Search .................. 324/158 F, 601, 637, 324/638, 641, 642, 646; 333/246, 263

[56] References Cited

U.S. PATENT DOCUMENTS

| | | | |
|---|---|---|---|
| 4,463,308 | 7/1984 | Underhill | 324/638 |
| 4,535,307 | 8/1985 | Tsukii | 333/35 |
| 4,816,767 | 3/1989 | Cannon et al. | 324/605 |
| 4,904,927 | 2/1990 | Garbe et al. | 324/642 |
| 4,982,164 | 1/1991 | Schiek et al. | 324/638 |
| 5,047,725 | 9/1991 | Strid et al. | 324/601 |
| 5,097,215 | 3/1992 | Eul et al. | 324/601 |

*Primary Examiner*—Kenneth A. Wieder
*Assistant Examiner*—Christopher M. Tobin
*Attorney, Agent, or Firm*—Hill, Steadman & Simpson

[57] ABSTRACT

For calibrating a network analyzer which has two test ports adapted to be connected to an object under test by means of lines or through free-space, the transmission and reflection parameters are measured in a first calibrating measurement either on a line which is connected in reflection-free fashion between the two test ports or on the free-space connection. Subsequently two or three further calibrating measurements are performed with the same free-space connection or the same line, respectively, on calibration standards which are implemented by reflection-symmetrical and reciprocal interfering objects or discontinuities inserted at two or three different positions in the free-space connection or the line, respectively.

12 Claims, 5 Drawing Sheets

CALIBRATING A NETWORK ANALYZER BY MAKING MULTIPLE MEASUREMENTS ON A COMMON TRANSMISSION LINE WITH A MOVABLE DISCONTINUITY

BACKGROUND OF THE INVENTION

Network analyzers for measuring the transmission and reflection parameters of any object under test disposed between two test ports must be calibrated with the help of so-called calibration standards in order to correct for system errors (see for example U.S. Pat. No. 4,982,164). Special methods or computation are used to obtain from the measured values resulting from said calibration measurements correction values or error characteristics which are subsequently taken into consideration for the actual object testing.

All of the conventional calibrating methods exhibit the common drawback that during the calibrating process the individual calibration standards are successively turned on and off, i.e. that they must be contacted afresh. This multiple change of calibration standards is especially troublesome when soldered or bonding connections between the test ports and the standards have to be broken and then made again. The use of the known calibrating methods is particularly disadvantageous also with those network analyzers in which antennas are connected to the test ports for radiating electromagnetic waves and in which in the free-space between the mutually spaced antennas the testing of objects such as humidity measurements are to be carried out on test objects disposed in the electromagnetic field between the antennas. The latter kind of network analyzers can be calibrated in accordance with known calibrating methods only by disposing the antennas successively at different mutual spacings and by accurately measuring said spacings, which cannot be done with high precision in the EHF-range.

SUMMARY OF THE INVENTION

It is an object of the present invention to provide a calibrating method for network analyzers in which the specified drawbacks of the prior art are avoided and by which precise calibration can be performed in a simple way both with network analyzers having a line connection to the object under test and with network analyzers having free-space connection with the object under test.

For a network analyzer of the line connection type the specified objective is achieved by a first embodiment of the method of the present invention for calibrating a network analyzer which has two test ports adapted to be connected via lines to an object under test, wherein in a first calibrating measurement, the transmission and reflection parameters are measured on a line of unknown propagation constant, particularly a stripline which is connected in reflection-free fashion between the two test ports, and with the same line three further calibrating measurements are performed on three calibration standards which are realized by reflection-symmetrical and reciprocal discontinuities inserted in the line at three different positions. It is also achieved by a second embodiment of the method of the present invention, wherein in a first calibrating measurement the transmission and reflection parameters are measured on a precision-type line of known propagation constant, particularly a waveguide which is connected in reflection-free fashion between the two test ports, and with the same precision-type line two further calibrating measurements are performed on two calibration standards which are realized by reflection-symmetrical and reciprocal discontinuities inserted in the precision-type line at two different positions.

For a network analyzer of the free-space connection type with the object under test the specified objective is achieved by a third embodiment of the present invention for calibrating a network analyzer which has two test ports adapted to be connected to an object under test via antennas and free-space, wherein in a first calibrating measurement the transmission and reflection parameters between the antennas of the free-space connection, which are disposed at a fixed distance from each other, are measured and two further calibrating measurements are performed on two further calibration standards which are realized by discontinuities which are disposed at two different positions intermediate the antennas and which are reflection-symmetrical and reciprocal in respect of electromagnetic waves.

Advantageous further embodiments of the method of the present invention are as follows.

In the third above described method of the present invention the discontinuities disposed in the free-space intermediate the antennas are realized by a plate-like or spherical member.

For automatic calibration the discontinuities are adapted to be movable between the different calibration positions by a controlled drive mechanism.

The mechanical distances between the different calibration positions of the discontinuities are selected to be equal.

The successive three or four calibrating measurements are performed with at least two different test port spacings and consequently different line lengths or antenna spacings, respectively (wide-band calibration). In the first and second above described methods of the present invention the mechanical distances between the different positions of the discontinuities along the line are determined, and on the basis thereof and from the measured values obtained during calibration the propagation constant of the line is computed.

A calibrating apparatus of the present invention for implementing the first above described method of the present invention for a network analyzer having two test ports, has an electrical line adapted to be connected between the two test ports of the network analyzer and a member adapted to be placed on the line in three different positions along the line so as to influence the electromagnetic field on the line. Further advantageous developments of the calibrating apparatus are as follows.

The member is adapted to be placed on the line in the different positions by means of a controlled drive mechanism.

The member is disposed for mechanical movement along the line.

The member is made of dielectric material.

The electrical line is a stripline formed by stripline technique on a substrate and adapted to be connected via bonding wires to the terminals of the test ports, the terminals being likewise formed by stripline technique.

A calibrating apparatus of the present invention for implementing the second above described method of the present invention for a network analyzer having two test ports, has a waveguide which is connectable intermediate the two test ports and which is adapted in at least two different positions to have respective members externally inserted therein and retracted therefrom, by which members the electromagnetic field in the waveguide can be influenced. The two members can be adapted to be inserted into and retracted from the waveguide through holes in the waveguide sidewall under the action of a mechanical drive mechanism.

In the first and second above described methods of the present invention it is no longer necessary during the subsequent calibrating measurements to break the connection between the test ports and the reflectionless line (e.g. stripline or waveguide) which is provided for the first calibrating measurement, because these subsequent calibrating measurements make use of the same line or the same waveguide while the additional calibration standards are realized merely by the insertion of respective discontinuities. When the electromagnetic wave propagation constant of the line for the first calibrating measurement is unknown, which is frequently the case when this line is configured, for example, as a stripline because in this case the propagation constant depends on the substrate material of the stripline, a total of four calibrating measurements is required in accordance with the first method. However, when the propagation constant is known as will be the case for precision lines such as aerial conductors or waveguides and also for the free-space connection, a total of only three calibrating measurements is necessary.

The discontinuities which are required for the further calibrating measurements along the line, the waveguide or the free-space connection can easily be realized. It is only necessary for these discontinuities to exhibit symmetry of reflection, i.e. the same reflection for electromagnetic waves from either side, and to be reciprocal, i.e. to exhibit the same transmission in either direction. In the case of a stripline formed on a substrate, pads are disposed at three different positions of the stripline after completion of the first calibrating measurement, these pads acting like a capacitor between the striplines at the point of placement so that they exhibit the required interference properties (symmetry of reflection and reciprocity). For all four necessary calibrating measurements the stripline remains fixedly connected to the test ports of the network analyzer, for instance by way of bonding wires, the length of the line and thus the spacing between the test ports remains the same for all calibrating measurements.

In the second above described method of the present invention using a waveguide of predetermined length between the two test ports for the first calibrating measurement, the symmetrically reflecting reciprocal discontinuities may easily be realized within the waveguide at two or three different positions along the same for instance by rods of dielectric material adapted to be inserted successively at different positions through holes in the wall of the waveguide. The realization of these discontinuities is even simpler in case of a free-space connection according to the third above described method of the present invention. It will be sufficient when a sphere or plate of a material which exhibits symmetry of reflection and reciprocity to electromagnetic waves is arranged at two different positions in the free-space between the antennas, and in this case the spacing between the antennas also remains the same for all calibrating measurements.

The general method according to the present invention also permits for the very first time the fully automatic calibration of a network analyzer because it is not necessary to break or to switch any connections between the individual calibrating measurements, and shifting of the objects under test towards the individual predetermined positions can easily be performed automatically by means of a correspondingly controlled electromagnetic drive mechanism.

The calibration precision depends solely on the reproducibility of the two or three discontinuities or interference objects during the calibrating process. In the case of calibration with a stripline onto which for example a pad is placed at different positions, it depends only on the precision with which the pressure of such a pad against the stripline can be reproduced. Basically, the mutual distances between the various positions of the discontinuities may be as desired, but it would be particularly advantageous to choose equidistant spacings because the computational evaluation will be facilitated thereby.

Another advantage of the method according to the present invention resides in that it is thereby readily possible to determine in a precise and rapid way the propagation constant for electromagnetic waves along a line. It is merely necessary to this end to accurately determine the distances between the interfering objects or discontinuities.

The order of the individual calibrating measurements may be chosen at random. When calibration is effected with lines, the characteristic impedance of the line is used as reference impedance, and for free-space calibration the intrinsic impedance of the free-space is used as the reference impedance.

For the first time, the method according to the present invention permits free-space calibration in the microwave and EHF-range due to the fact that during calibration the distance between the antennas remains the same so that exact distance measurement is unnecessary.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENT

Figure 1:
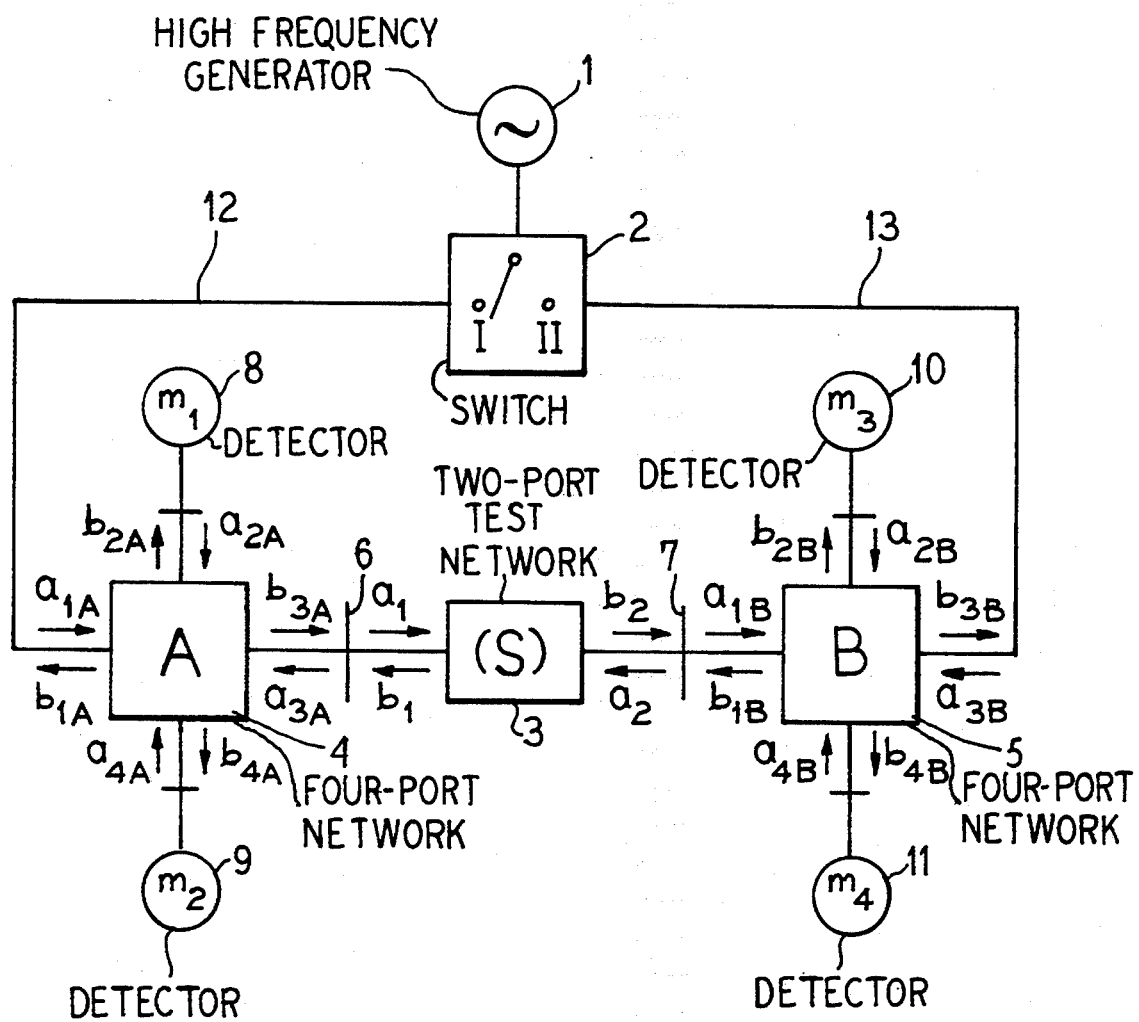
FIG. 1 is a block diagram of a conventional network analyzer.

FIG. 1 is a basic circuit diagram of a conventional network analyzer (for example network analyzer ZPV-Z5 of Rohde & Schwarz) in which by way of a three-port 2 such as a change-over switch two separate test circuits 12 and 13 are fed from a high-frequency generator 1 which is variable within a predetermined frequency range. The two test circuits 12 and 13 which are adapted to be turned on alternately lead to four-ports 4 and 5 which are designed as measuring bridges or waveguide couplers and to which signal detectors 8, 9 and 10, 11, respectively, are coupled by means of which voltage measurements as to magnitude and phase may be performed. These signal detectors may be mismatched. The four-ports 4 and 5 also have test ports 6 and 7 coupled thereto between which a two-port 3 can be connected as the object under test. It is thus possible via the signal detectors 7, 8 and 10, 11 to measure on an intermediate object under test 3 at the input and output thereof the complex reflection factors $S_{11}$ and $S_{22}$ as well as the complex transmission factors $S_{21}$ and $S_{12}$ both in forward and backward direction. These four measured complex stray parameters $S_{11}$, $S_{22}$, $S_{12}$ and $S_{21}$ therefore completely describe a linear two-port for every frequency, and any further measurable variables of interest may be determined from these values.

In such network analyzers (NWA's) a calibrating measurement is necessary for determining system errors prior to the actual measurement of the object under test. To this end various calibration standards are connected between the test ports 6 and 7 instead of the object 3 under test, and the stray parameters are again determined therefrom. Based thereon the respective error characteristics of the network analyzer are then determined and are stored and taken into account for the later measurement of the object under test.

With network analyzers of this kind the test ports 6 and 7 may be designed in different ways, for instance they may be configured as coaxial socket connectors or coaxial plug-connectors or waveguide couplers, or they may be connected to antennas disposed in spaced relationship for generating an electromagnetic field therebetween. The calibrating principle of the present invention is suited for all of these different test port configurations.

Figure 2:
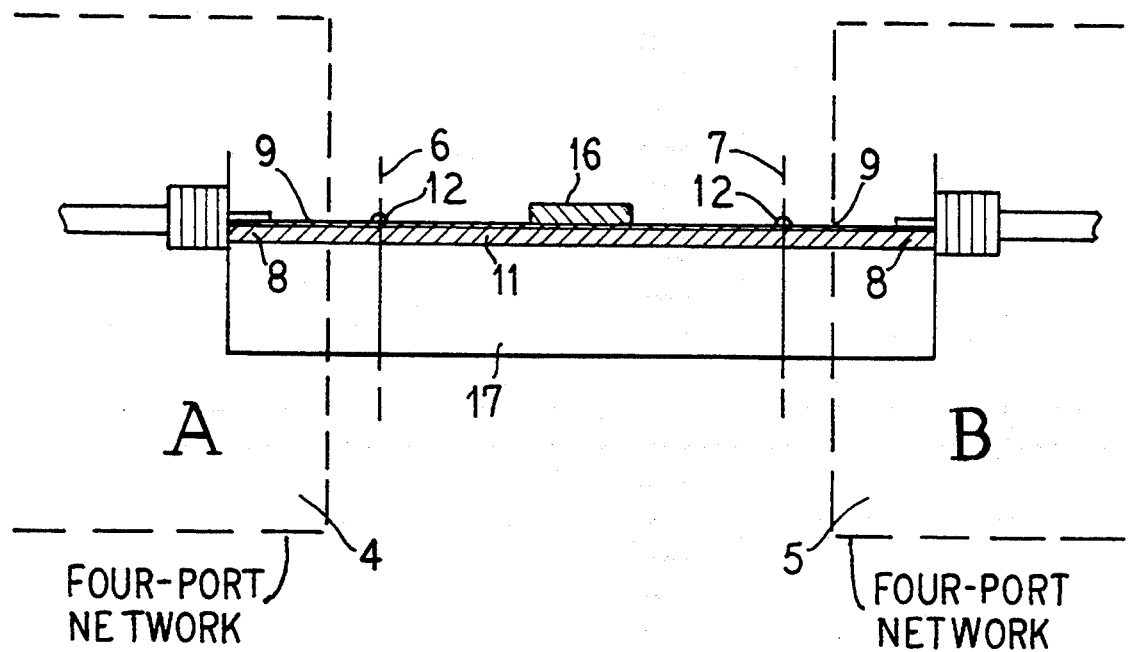
FIG. 2 is a cross-sectional view of an embodiment of the present invention in a network analyzer.
Figure 3A:
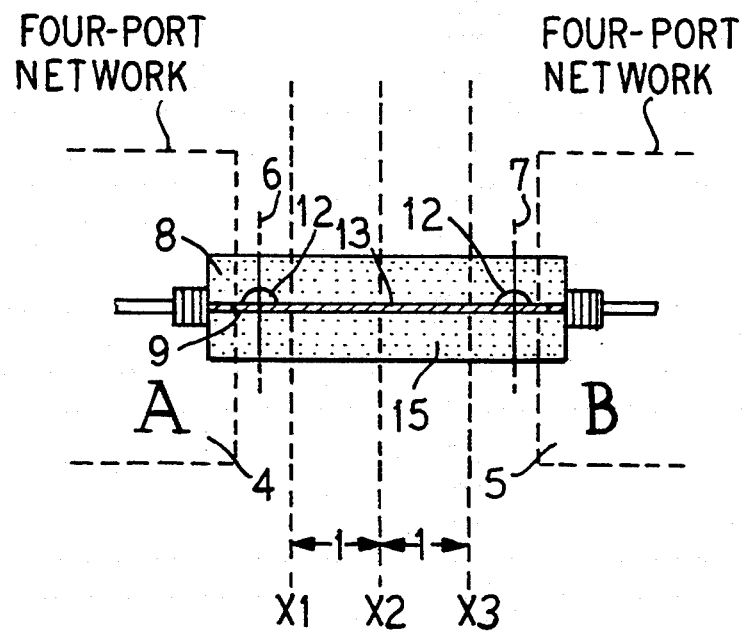
FIG. 3 is a plan view depicting a calibration operation for the network analyzer.
Figure 3B:
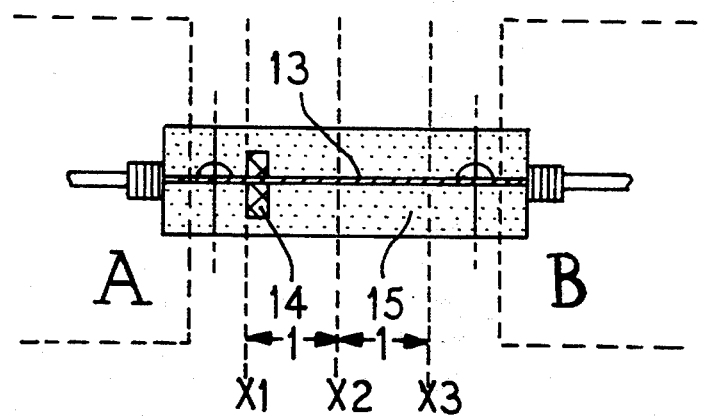
Figure 3C:
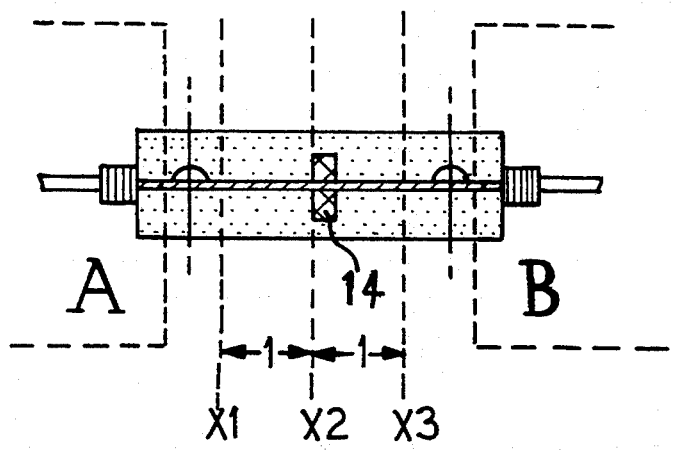
Figure 3D:
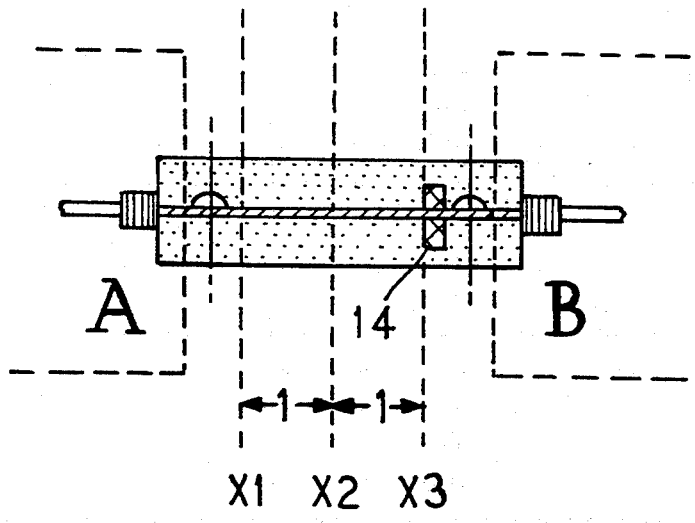

FIG. 2 is a cross-section showing the application of the invention in a network analyzer the test ports 6 and 7 of which are configured as striplines 9 formed on a substrate 8 which is advantageous for measurements at a test object 16 formed by stripline technique on a substrate 11 having a ground surface laminated on the back thereof and mounted on a metallic support 17. The test object is connected for instance via bonding wires between the striplines 9 of the test ports 6 and 7.

FIG. 3 is a plan view schematically illustrating the calibrating operation for a network analyzer, the test ports 6 and 7 of which are configured as shown in FIG. 2 and have a calibration standard 13, 14, 15 connected therebetween instead of the test object 11, 16.

First, as shown in section a of FIG. 3 a stripline 13 of random length, which is provided on a substrate 15 again formed with a ground surface on the back thereof, is connected between the two test ports 6 and 7 disposed at a random distance from one another, wherein the connection between the stripline 13 and the striplines 9 of the test ports 6 and 7 is effected via bonding wires 12. A first calibrating measurement is initially performed with this arrangement according to section a of FIG. 3, and the transmission and reflection parameters of said stripline 13 are determined.

Thereafter, as shown in sections b, c and d of FIG. 3, three further calibrating measurements are performed with the same stripline 13 which is still connected between the test ports 6 and 7, wherein a pad 14 is first placed at position X1 of the stripline 13, the pad 14 being made for instance of dielectric material or possibly of metal for very high frequencies and acting as a reflection-symmetrical and reciprocal discontinuity in the line 13, for instance as a capacitor connected into the line. After completion of the calibrating measurement with the array of second b of FIG. 3b, the pad 14 is shifted to position X2 and a calibrating measurement is again performed. Lastly a final calibrating measurement is performed with the array of section d of FIG. 3 with the pad 14 in position X3. Basically, the distance 1 between the shift positions X1, X2, X3 may vary, but preferentially the distance 1 is chosen to be respectively identical so as to facilitate an evaluation.

The pressure at which the pad 14 is pressed against the stripline 13 must be the same for the three calibrating measurements of sections b, c and d of FIG. 3 since the calibration precision depends thereon.

With a calibrating arrangement in accordance with FIG. 3 the propagation constant of line 13 can also readily be established. To this end it is merely necessary during measurement to exactly measure the distances 1 so that the propagation constant can be exactly calculated under consideration of the stray parameters obtained during the calibrating measurement. In this case equidistant spacings are also advantageous.

Figure 4A:
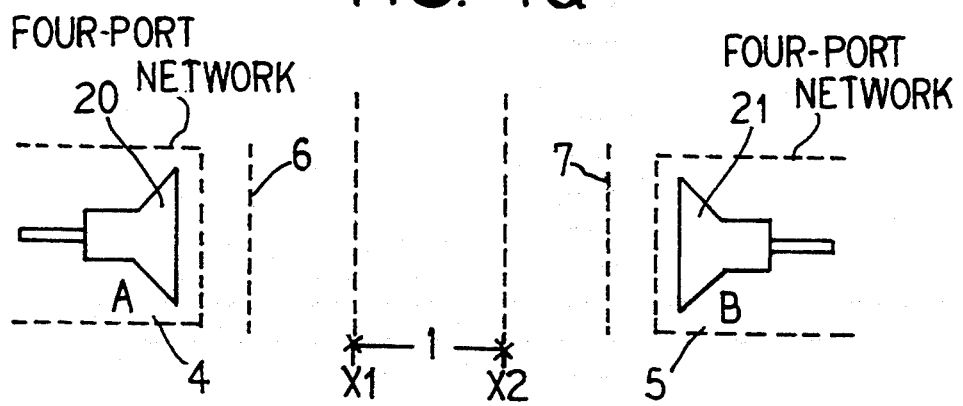
FIG. 4 depicts the use of the calibrating method of the present invention with a network analyzer.
Figure 4B:
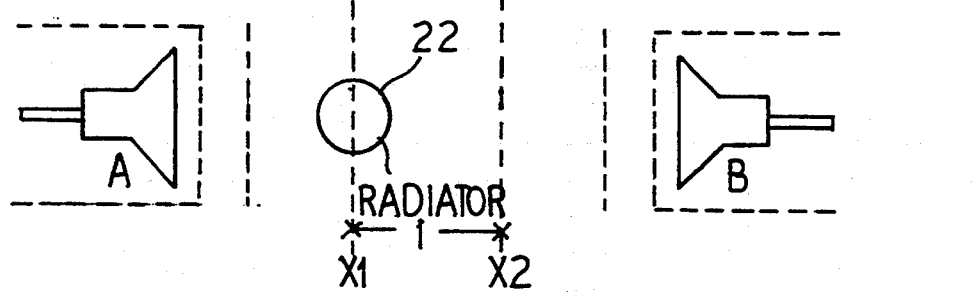
Figure 4C:
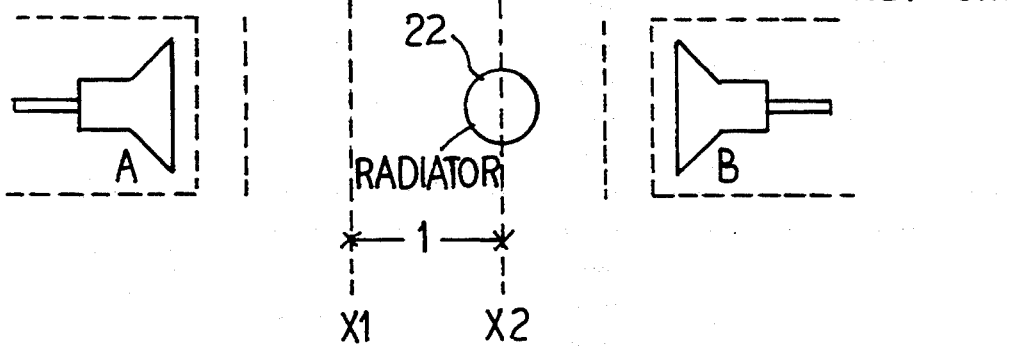

FIG. 4 shows the use of the calibrating method of the instant invention with a network analyzer whose test ports 6 and 7 are disposed in free-space and are formed by antennas, for example horn radiators 20, 21 which are disposed with a predetermined spacing from one another and generate an electromagnetic field therebetween. Such an arrangement is used for example to perform humidity measurements on a test object placed therebetween. With this free-space measuring arrangement the method of the present invention can be performed very easily because in this case the propagation constant in air is known, and thus in this case no more than three calibrating measurements are required.

According to section a of FIG. 4 the two horn radiators 20, 21 are disposed at a random distance from each other and a first calibrating measurement is then performed. Thereafter and as shown in section b of FIG. 4, a sphere 22 for example of dielectric material or possibly metal is disposed at a position X1 in the space between the two equidistantly held horn radiators 20, 21 and a second calibrating measurement is performed. Subsequently, this sphere 22 is shifted to position X2 as shown in section c of FIG. 4 and another calibrating measurement is performed. Based on the obtained measured values it is possible to determine all stray parameters required for error correction.

This method according to FIG. 4 comprising a total of only three calibrating measurements is also suited for lines when the propagation constant of the line is known, as will be the case for precision lines, aerial conductors or wave-guides. For such lines the calibrating method of FIG. 3 is reduced to steps a, b and c.

Figure 5:
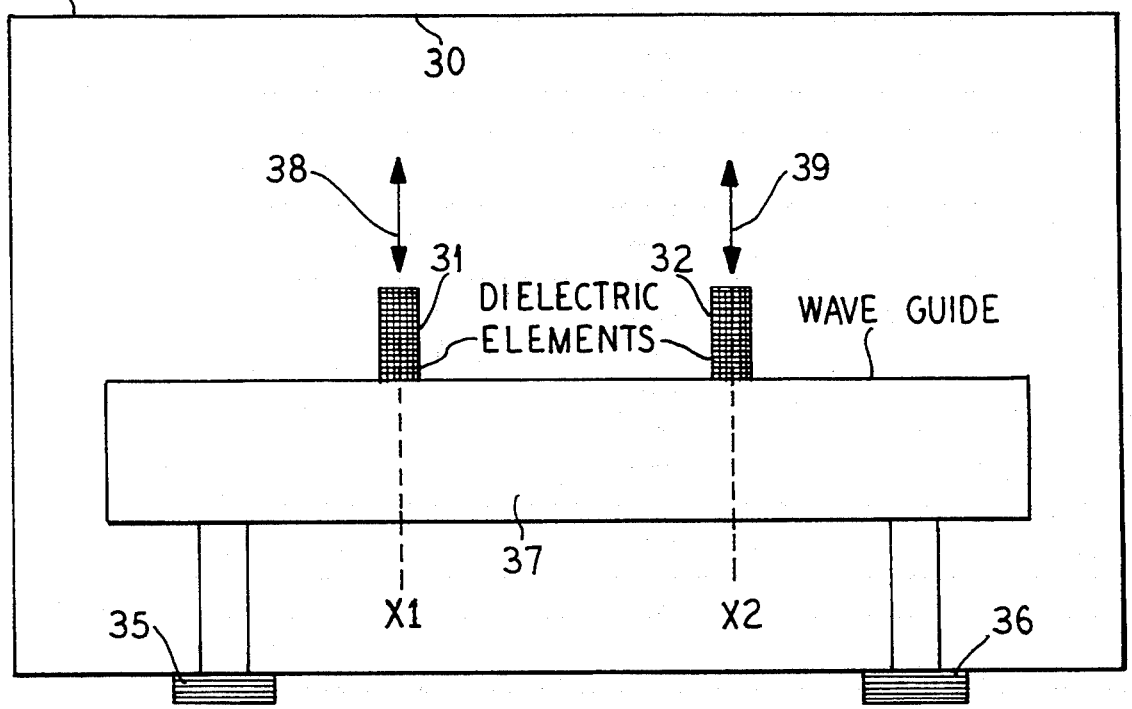
FIG. 5 depicts a calibrating apparatus of the present invention constructed with a waveguide.
Figure 5:
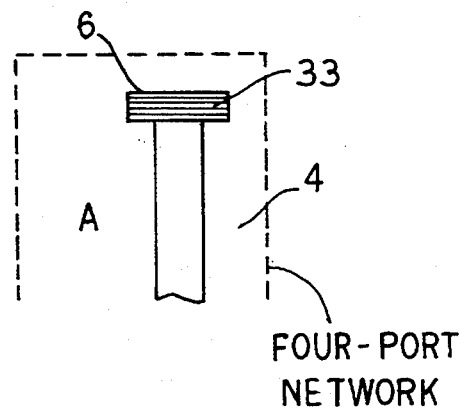
Figure 5:
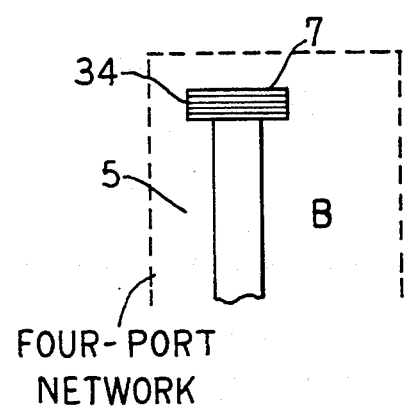

FIG. 5 illustrates such a calibrating apparatus constructed with a waveguide 37, which permits fully automatic calibration of a network analyzer. In this example, the test ports 6 and 7 are formed by coaxial couplings 33 and 34 on which corresponding coaxial couplings 35, 36 of a calibration standard 30 can be placed. Via coaxial conductors these coaxial couplings 35 and 36 lead into the waveguide 37, and the measuring signals are converted to the waveguide wave by coupling means (not illustrated) within the waveguide 37. One sidewall of the waveguide 37 is formed with holes through which dielectric elements 31 and 32 can be inserted and retracted from outside. This is effected automatically by a non-illustrated electromagnetic drive mechanism by means of which the dielectric elements 31 and 32 are axially movable in the directions of the dual-head arrows 38 and 39. During the first calibrating measurement both elements 31, 32 are retracted from the waveguide, and a first calibrating measurement is performed only with the waveguide 37 connected between the test ports 6, 7. Subsequently, the first element 31 is inserted by the drive mechanism into the waveguide at position X1, and a second calibrating measurement is performed. Then, the element 31 is retracted from the waveguide 37 and instead the second element 32 is inserted in the waveguide at position X2, and another calibrating measurement is performed. These three successive calibrating measurements can be performed fully automatically by means of the drive mechanism integrated in the calibration standard 30 so that it is possible for the very first time to perform fully automatic calibration with such a calibration standard 30.

The determination of the stray parameters from the measured values is performed as known per se for example in accordance with Heuermann, Eul, Schiek, "Robuster Algorithmus zur Streuparameterbestimmung für systemfehlerkorrigierte Netzwerkanalysatoren", Kleinheubacher Berichte 1991 vol. 35. With this procedure the measured values of the actual object measurement are stripped of system errors with the correction values being known ($A_{ij}$ and $B_{ij}$ coefficients, respectively). The basic circuit diagram of FIG. 1 shows that the network analyzer comprises four test points.

The following mathematical explanations for determining the correction coefficients are based on the work of Eul, Schiek, "A Generalized Theory and New Calibration Procedure for Network Analyzer Self-Calibration", IEEE Transactions on Microwave Theory and Technics, MTG 39, March 1991.

Represented as transmission parameters, the vector equations of the mutually independent measuring values $m_1$, $m_2$, $m_3$ and $m_4$ for the first position I of the switch and $m'_1$, $m'_2$, $m'_3$, $m'_4$ for the second position II of the switch are combined in accordance with the so-called 4-port/2-port reduction to form a matrix equation:

$$\begin{bmatrix} m_1 & m'_1 \\ m_2 & m'_2 \end{bmatrix} = [A][N][B]^{-1} \begin{bmatrix} m_3 & m'_3 \\ m_4 & m'_4 \end{bmatrix}, \quad (1)$$

$$\Rightarrow [M] = [A][N][B]^{-1}, \quad (2)$$

with the measured-value matrix $$[M] = \begin{bmatrix} m_1 & m'_1 \\ m_2 & m'_2 \end{bmatrix} \begin{bmatrix} m_3 & m'_3 \\ m_4 & m'_4 \end{bmatrix}^{-1}. \quad (3)$$

The $A_{ij}$ and $B_{ij}$ coefficients of the 2*2 matrices [A] and [B] are the 8 unknown correction quantities which may be reduced to 7 by fixing one of the 8 correction quantities. Considering first in FIG. 3 the left-hand line and the center line as reference planes for deriving the so-called self-calibration, one obtains with the line through-connection ([L]) for the first calibrating measurement:

$$\Rightarrow [M_L] = [A][L][B]^{-1} \quad (4)$$

in which $$[L] = \begin{bmatrix} e^{-\gamma l} & 0 \\ 0 & e^{+\gamma l} \end{bmatrix} = \begin{bmatrix} E_1 & 0 \\ 0 & 1/E_1 \end{bmatrix}, \quad (5)$$

where the following abbreviation has been introduced:

$$E_1 = e^{-\gamma l} \quad (6)$$

$\gamma$ is the propagation constant, and $l$ is the length of the line system.

The transmission parameter matrix of the object to be calibrated is [Q]. For the second calibrating measurement it can be written as $$[M_{N1}] = [A][N1][B]^{-1} \quad (7)$$

in which $$[N1] = [Q][L] \quad (8)$$

with $$[Q] = \begin{bmatrix} q_{11} & q_{12} \\ q_{21} & q_{22} \end{bmatrix}. \quad (9)$$

According to a theorem of the linear mapping theory the following holds: square matrices $[A_1]$ and $[A_2]$ for which the following holds:

$$[A_2] = [S]^{-1}[A_1][S] \text{ or } [S][A_2] = [A_1][S] \quad (10)$$

([S]: regular matrix) are similar matrices. Similar matrices have the following characteristics:

$$\text{spur}([A_1]) = \text{spur}([A_2]); \det([A_1]) = \det([A_2]). \quad (11)$$

For a square matrix, "det" is the determinant, and "spur" is the so-called trace or spur which is formed from the sum of the matrix elements of the main diagonals.

For equation (4) one obtains $$[B]^{-1} = [L]^{-1}[A]^{-1}[M_L] \quad (12)$$

and when substituted in equation (7) there follows:

$$[M_{N1}][M_L]^{-1} = [A][N1][L]^{-1}[A]^{-1} \quad (13)$$

Using the theorem for similar matrices one obtains $$\underbrace{\text{spur}([M_{N1}][M_L]^{-1})}_{\beta_1} = \text{spur}([N1][L]^{-1}), \quad (14)$$

from which there results the first self-calibration equation for determining the unknown calibration 2-port Q:

$$\beta_1 = q_{11} + q_{22} \quad (15)$$

Combining the second and the third calibrating measurements, the evaluation of $$\underbrace{\text{spur}([M_{N1}][M_{N2}]^{-1})}_{\beta_2} = \text{spur}([N1][N2]^{-1}), \quad (16)$$

in which $$[N2] = [L][Q] \quad (17)$$

results in the second required conditional equation:

$$2 - \beta_2 = q_{12}q_{21}(2\cosh(\gamma l) - 2) \quad (18)$$

In this respect use has been made of the postulated property that [Q] is the matrix of a reciprocal 2-port:

$$1 = q_{11}q_{22} - q_{12}q_{21} \quad (19)$$

Considering in FIG. 3 the left-hand and the right-hand lines as reference lines it is possible by combining the second and the fourth calibrating measurement through $$\underbrace{\text{spur}([M_{N1}][M_{N3}]^{-1})}_{\beta_3} = \text{spur}([N1][N3]^{-1}), \quad (20)$$

in which $$[N1] = [Q][L][L]; \; [N3] = [L][L][Q] \quad (21)$$

to derive the last required conditional equation for the self-calibration parameters.

$$2 - \beta_3 = q_{12}q_{21}(2\cosh(4\gamma l) - 2) \quad (22)$$

Dividing equation (18) by equation (22) one obtains a second-degree equation for determining the complex propagation constant $\gamma$ with the mechanical length l being known:

$$\cosh(2\gamma l) = \frac{1}{4\beta_4}\{1 \pm \sqrt{1 - 8\beta_4 + 16\beta_4^2}\}, \quad (23)$$

where $\beta_4$ is defined as follows:

$$\beta_4 = \frac{2 - \beta_2}{2 - \beta_3}. \quad (24)$$

To make the decision of sign it is necessary to have preliminary information about the propagation constant $\gamma$, but this does not constitute a practical limitation.

If the propagation constant $\gamma$ is known the computing steps from equation (20) to equation (24) will be omitted.

If the mechanical length l was given incorrectly, the result for $\gamma$ would likewise be incorrect, but the product of $\gamma l$ would still be exact. As both parameters subsequently occur only in the form of this product the incorrectly given mechanical length does not affect the calibration accuracy.

Considering the initially required property that the network should be reflection-symmetrical the following holds in transmission parameters:

$$q_{21} = -q_{12} \quad (25)$$

Substituted in equation (18) one obtains:

$$q_{21} = \pm\sqrt{\frac{\beta_2 - 2}{2\cosh(2\gamma l) - 2}} \quad (26)$$

Substituting (15) in (19) one obtains after short computation the conditional equations for the two further q-quantities $$q_{11} = \frac{\beta_1}{2} \pm \sqrt{\frac{\beta_1^2}{4} + q_{21}^2 - 1} \quad (27)$$

and direct from (15) one obtains $$q_{22} = \beta_1 - q_{11} \quad (28)$$

Transforming the problem to stray parameters, the sign decisions are reduced to the evaluation of the passivity of the calibration standard.

Furthermore (similar to the previous calibrating methods) the phase of the reflection characteristic of the network to 180° must be known so that the second sign decision can be made.

When all $q_{ij}$ coefficients and the product $\gamma l$ of propagation constant and length are known, the so-called self-calibration is complete. Thus, four calibrating measurements with completely known standards are available. However, for the computation of the $A_{ij}$ and $B_{ij}$ correction coefficients one requires only three calibrating measurements with known standards.

Hence, there is sufficient information available for computing the correction values in the conventional way.

If it is desired to operate with non-equidistant step lengths, one will obtain from equation (23) a non-linear equation from which the propagation constant $\gamma$ can only be determined numerically. Otherwise, the further computations remain the same.

When one or more additional measurements are performed in further positions on the object under calibration, the redundancy can be utilized by introducing a calculus of observations.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A method for calibrating a network analyzer which has two test ports connectable via lines to an object under test, comprising the steps of: measuring in a first calibrating measurement transmission and reflection parameters on a line of unknown propagation constant which is connected in reflection-free fashion between said two test ports; and with said same line performing three further calibrating measurements on three calibration standards which are realized by discontinuities, that have symmetry of reflection and that are reciprocal, inserted in said line at three different positions along said line, said line being always connected to said two test ports during the first and the three further calibrating measurements that thereby provide the complex transmission and reflection factors $S_{11}$, $S_{22}$, $S_{21}$ and $S_{12}$.

2. The method as claimed in claim 1, wherein for automatic calibration the discontinuities are movable between the different positions by a controlled drive mechanism.

3. The method as claimed in claim 1, wherein physical distances between the different positions of said discontinuities are selected to be equal.

4. The method as claimed in claim 1, wherein said first and said three further successive calibrating measurements are performed with at least two different test port spacings and consequently different line lengths.

5. The method as claimed in claim 1, wherein physical distances between the different positions of the discontinuities along the line are determined and wherein on the basis thereof and from measured values obtained during calibration a propagation constant of the line is computed.

6. The method as claimed in claim 1, wherein said line of unknown propagation constant is a stripline.

7. A calibrating apparatus for calibrating a network analyzer which has two test ports comprising: an electrical line removably connected between said two test ports of the network analyzer; and an element placeable on said line in three different positions along said line so as to influence the electromagnetic field of said line; wherein in a first calibrating measurement transmission and reflection parameters are measured on the line that has an unknown propagation constant and that is connected in reflection-free fashion between said two test ports, and with said line three further calibrating measurements are respectively performed at said three different positions, said line being always connected to said two test ports during the first and the three further calibrating measurements that thereby provide the complex transmission and reflection factors $S_{11}$, $S_{22}$, $S_{21}$ and $S_{12}$.

8. The calibrating apparatus as claimed in claim 7, wherein said element is placeable on said line in said different positions by means of a controlled drive mechanism.

9. The calibrating apparatus as claimed in claim 7, wherein said element is physically movable along said line.

10. The calibrating apparatus as claimed in claim 7, wherein said element is made of dielectric material.

11. The calibrating apparatus as claimed in claim 7, wherein the electrical line is a stripline formed by stripline technique on a substrate and connectable via bonding wires to terminals of the test ports, said terminals being also formed by stripline technique.

12. A method for calibrating a network analyzer which has two test ports connectable via electromagnetic transmission means having an electromagnetic transmission medium to an object under test, comprising the steps of: connecting the two test ports via an electromagnetic transmission medium; measuring in a first calibrating measurement transmission parameters and reflection parameters of said medium; and with said same electromagnetic medium performing at least two further calibrating measurements on at least two calibration standards which are realized by discontinuities, that have symmetry of reflection and that are reciprocal, inserted in said electromagnetic medium at different positions along said line, said line being always connected to said two test ports during the first and the two further calibrating measurements that thereby provide the complex transmission and reflection factors $S_{11}$, $S_{22}$, $S_{21}$ and $S_{12}$.

* * * * *